(12) United States Patent
Baek

(10) Patent No.: US 12,320,833 B2
(45) Date of Patent: Jun. 3, 2025

(54) METHOD FOR FABRICATING TEST SOCKET

(71) Applicant: LEENO INDUSTRIAL INC., Busan (KR)

(72) Inventor: Seungha Baek, Busan (KR)

(73) Assignee: LEENO INDUSTRIAL INC., Busan (KR)

(*) Notice: Subject to any disclaimer, the term of this patent is extended or adjusted under 35 U.S.C. 154(b) by 418 days.

(21) Appl. No.: 17/769,963

(22) PCT Filed: May 18, 2021

(86) PCT No.: PCT/KR2021/006238
§ 371 (c)(1),
(2) Date: Apr. 18, 2022

(87) PCT Pub. No.: WO2021/235843
PCT Pub. Date: Nov. 25, 2021

(65) Prior Publication Data
US 2022/0373576 A1 Nov. 24, 2022

(30) Foreign Application Priority Data
May 22, 2020 (KR) .................. 10-2020-0061458

(51) Int. Cl.
*G01R 3/00* (2006.01)
*B29C 43/18* (2006.01)
(Continued)

(52) U.S. Cl.
CPC .............. *G01R 3/00* (2013.01); *B29C 43/18* (2013.01); *B29C 43/206* (2013.01); *G01R 1/045* (2013.01); *G01R 1/07314* (2013.01)

(58) Field of Classification Search
CPC ...... G01R 1/045; G01R 1/07314; G01R 3/00; B29C 43/18; B29C 43/20
(Continued)

(56) References Cited

U.S. PATENT DOCUMENTS
2004/0212383 A1 10/2004 Yanagisawa et al.
2006/0094134 A1 5/2006 Yoshida
(Continued)

FOREIGN PATENT DOCUMENTS
JP 10-221372 A 8/1998
JP 2002-174643 A 6/2002
(Continued)

OTHER PUBLICATIONS

Communication dated Feb. 28, 2023, issued in Japanese Application No. 2022-519445.
(Continued)

*Primary Examiner* — Philip C Tucker
*Assistant Examiner* — Brian R Slawski
(74) *Attorney, Agent, or Firm* — Sughrue Mion, PLLC

(57) ABSTRACT

The disclosure relates to a method of fabricating a test socket including forming a plate-shaped first coupling block by joining a first base member made of a conductive material and a first insulating member made of an insulating material; forming a plate-shaped second coupling block by joining a second base member made of the conductive material and a second insulating member made of the insulating material; forming a first barrel accommodating hole for accommodating a part of the probe and a first support hole for supporting one end portion of the probe in the first coupling block; forming a second barrel accommodating hole for accommodating the rest of the probe and a first support hole for supporting the other end portion of the probe in the second coupling block; inserting one end of the probe into the first (Continued)

barrel accommodating hole to be supported on the first support hole, and inserting the other end of the probe into the second barrel accommodating hole to be supported on the second support hole; and joining the first coupling block and the second coupling block.

15 Claims, 19 Drawing Sheets

(51) Int. Cl.
*B29C 43/20* (2006.01)
*G01R 1/04* (2006.01)
*G01R 1/073* (2006.01)

(58) Field of Classification Search
USPC .... 156/60, 64, 91, 92, 242, 245, 292, 307.1, 156/307.7, 308.2, 309.6; 324/755.01, 324/755.05, 754.08, 756.02, 756.03, 324/756.07, 762.01, 762.02; 257/48; 438/14, 17
See application file for complete search history.

(56) References Cited

U.S. PATENT DOCUMENTS

| | | |
|---|---|---|
| 2007/0145990 A1 | 6/2007 | Fukushima et al. |
| 2008/0088331 A1 | 4/2008 | Yoshida |
| 2010/0188112 A1 | 7/2010 | Yoshida |
| 2011/0102008 A1* | 5/2011 | Lee .................. G01R 1/0466 324/762.06 |
| 2018/0188290 A1 | 7/2018 | Park et al. |
| 2021/0132114 A1 | 5/2021 | Park et al. |

FOREIGN PATENT DOCUMENTS

| | | | |
|---|---|---|---|
| JP | 2004-325305 A | | 11/2004 |
| JP | 2005-55294 A | | 3/2005 |
| JP | 2005055294 A | * | 3/2005 |
| JP | 2006-66205 A | | 3/2006 |
| JP | 2006-125988 A | | 5/2006 |
| JP | 2007-178163 A | | 7/2007 |
| JP | 2007-178165 A | | 7/2007 |
| JP | 2008-70146 A | | 3/2008 |
| JP | 2009156710 A | * | 7/2009 |
| JP | 4431780 B2 | | 3/2010 |
| JP | 2010-175371 A | | 8/2010 |
| JP | 4921344 B2 | | 4/2012 |
| JP | 2016-191553 A | | 11/2016 |
| JP | 2018-529932 A | | 10/2018 |
| KR | 10-2009-0090854 A | | 8/2009 |
| KR | 10-2010-0068549 A | | 6/2010 |
| KR | 10-2011-0015474 A | | 2/2011 |
| KR | 10-1047430 B1 | | 7/2011 |
| TW | 202004192 A | | 1/2020 |
| WO | 2009/102029 A1 | | 8/2009 |
| WO | 2019/225967 A1 | | 11/2019 |

OTHER PUBLICATIONS

Japanese Office Action dated Aug. 1, 2023 in Application No. 2022-519445.
Office Action issued Jul. 27, 2022 in Taiwanese Application No. 110113185.
International Search Report for PCT/KR2021/006238 dated Sep. 6, 2021 [PCT/ISA/210].
Written Opinion for PCT/KR2021/006238 dated Sep. 6, 2021 [PCT/ISA/237].
Korea Office Action for 10-2020-0061458 dated Apr. 9, 2021.
Korea Notice of Allowance for 10-2020-0061458 dated Jul. 27, 2021.

* cited by examiner

[Figure 1]
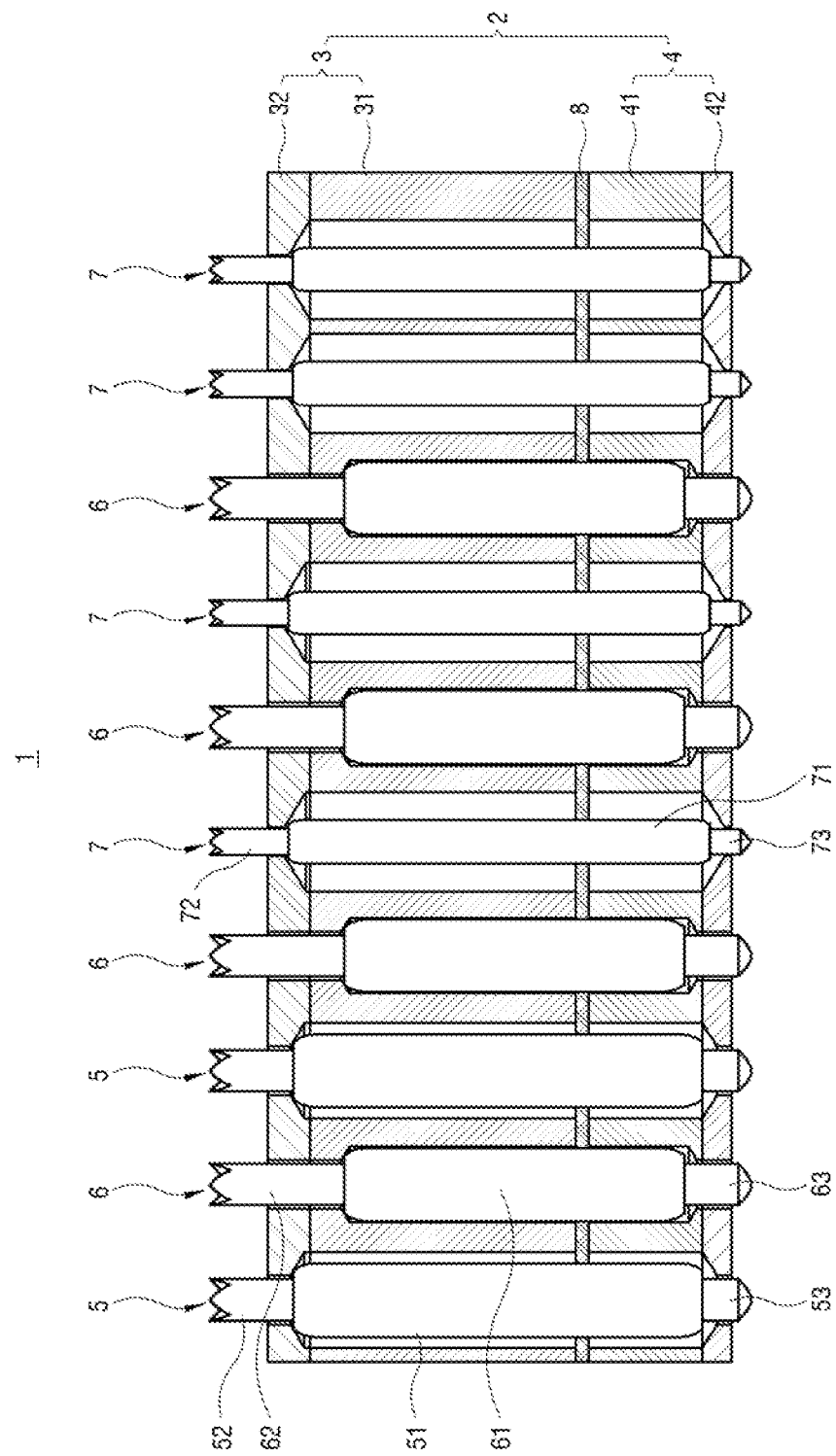

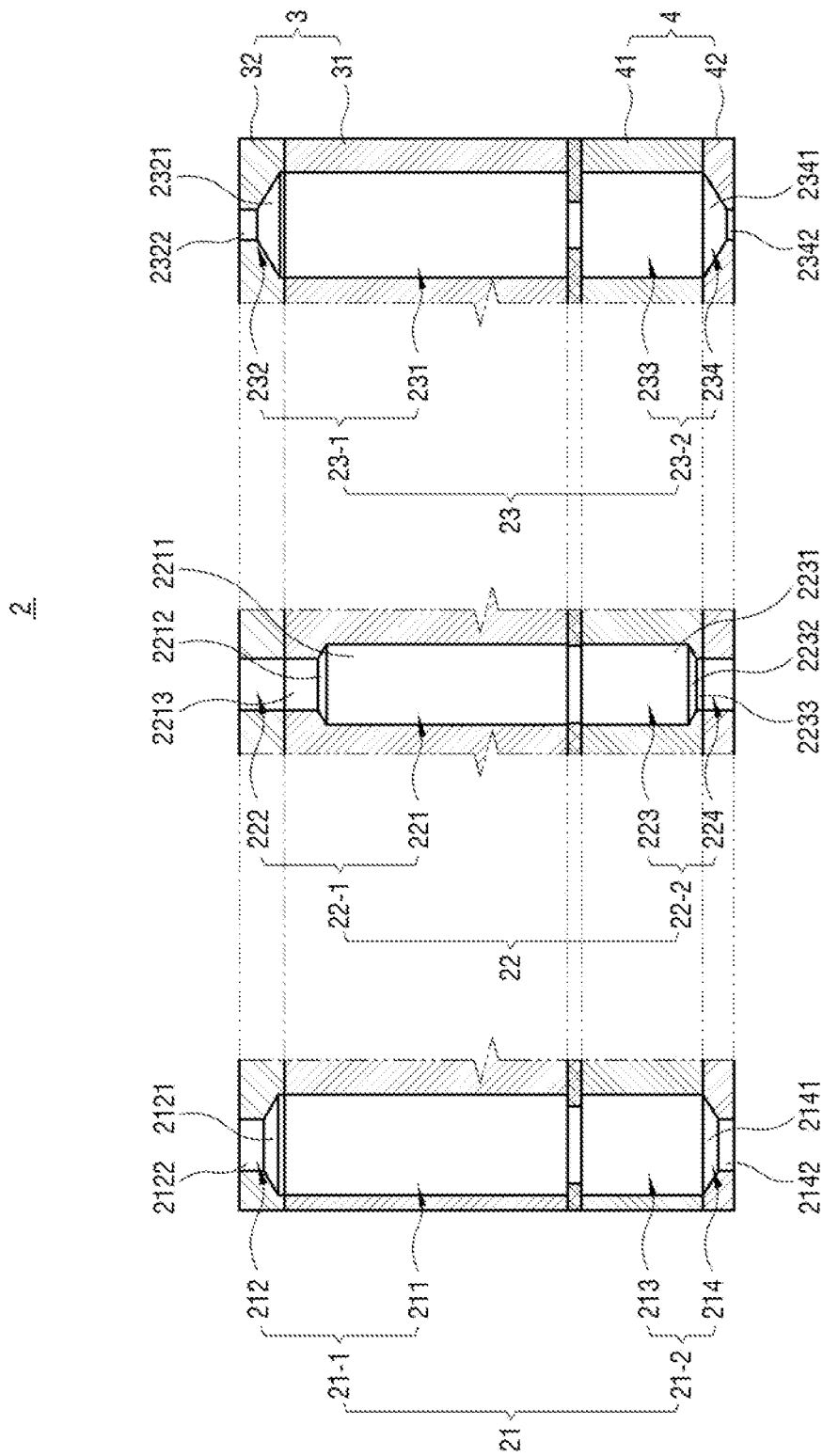
[Figure 2]

【Figure 3】
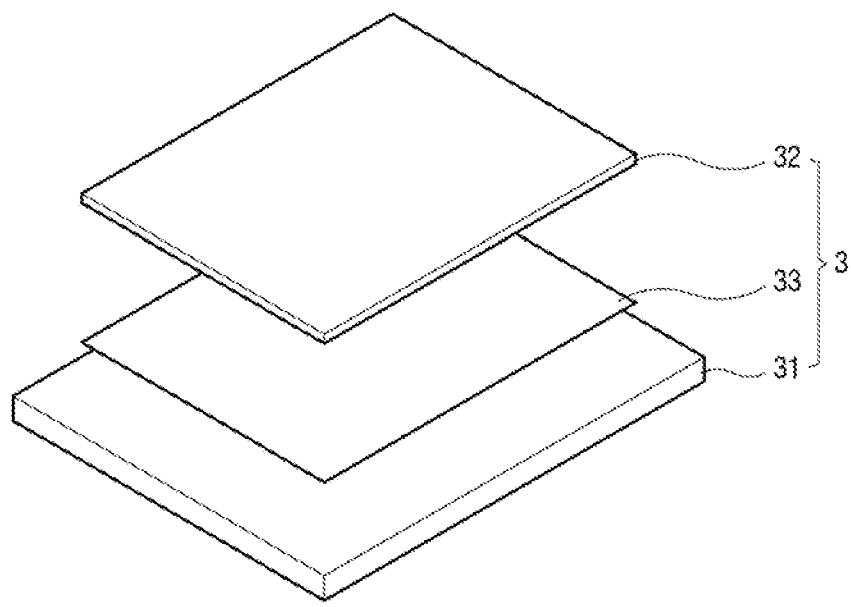
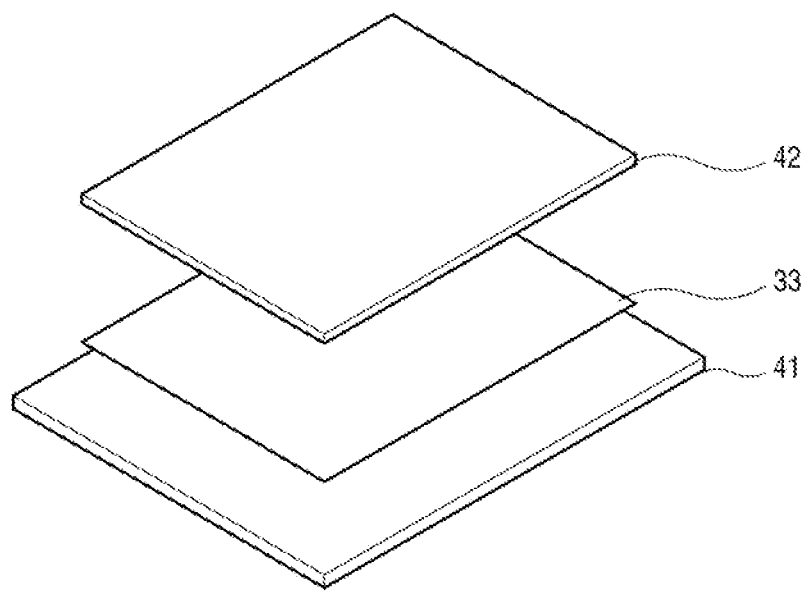

[Figure 4]
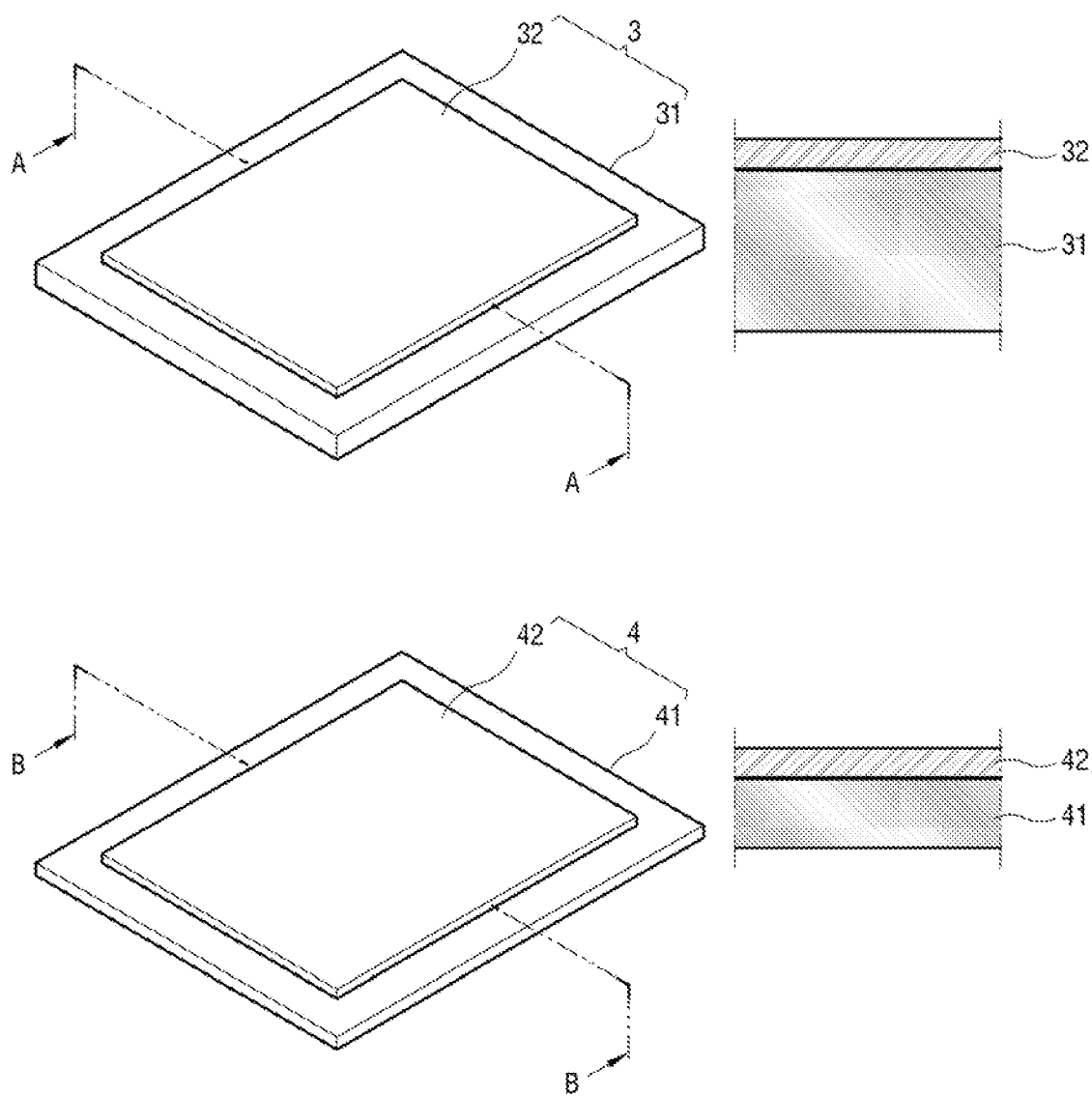

[Figure 5]
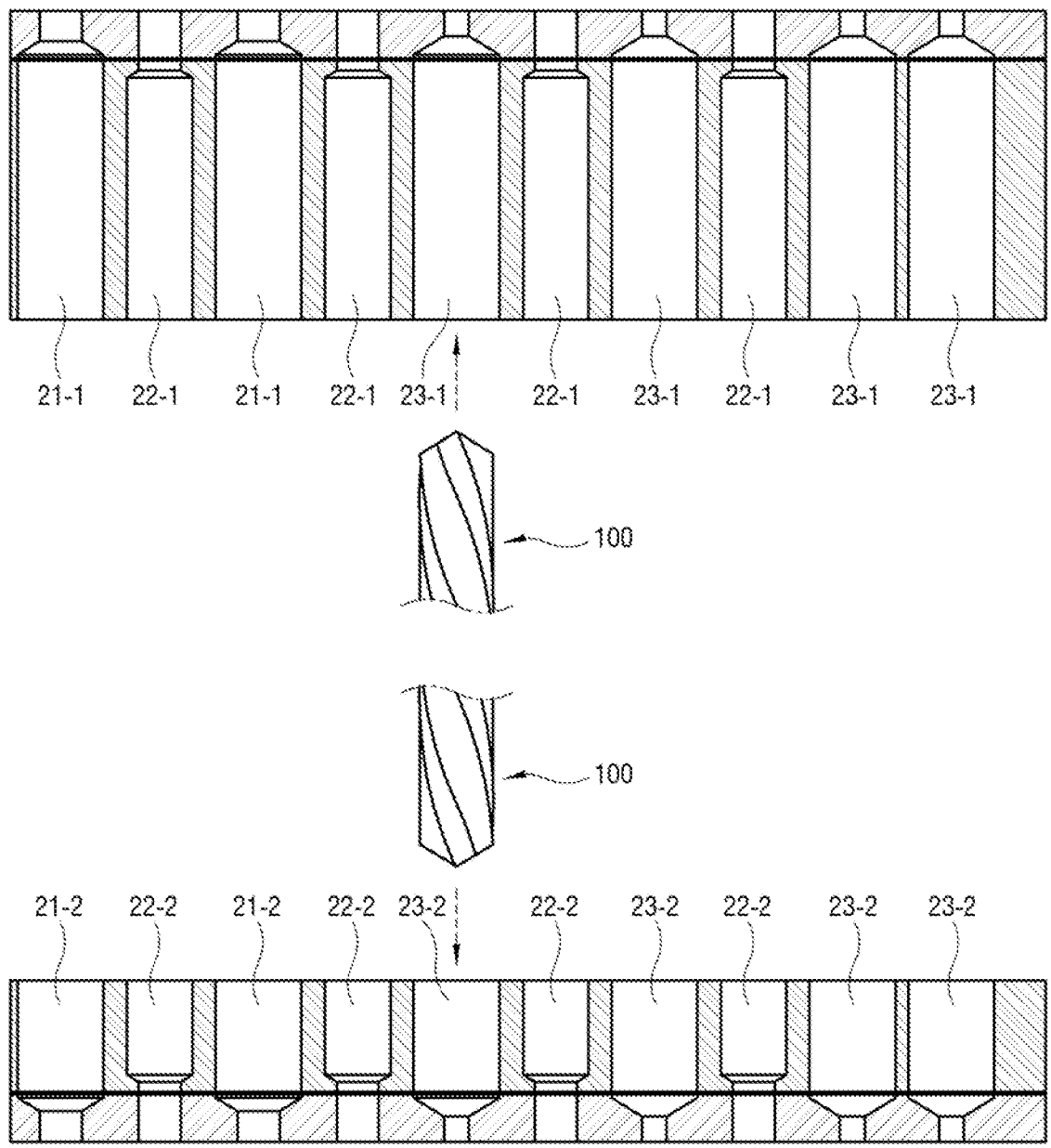

[Figure 6]
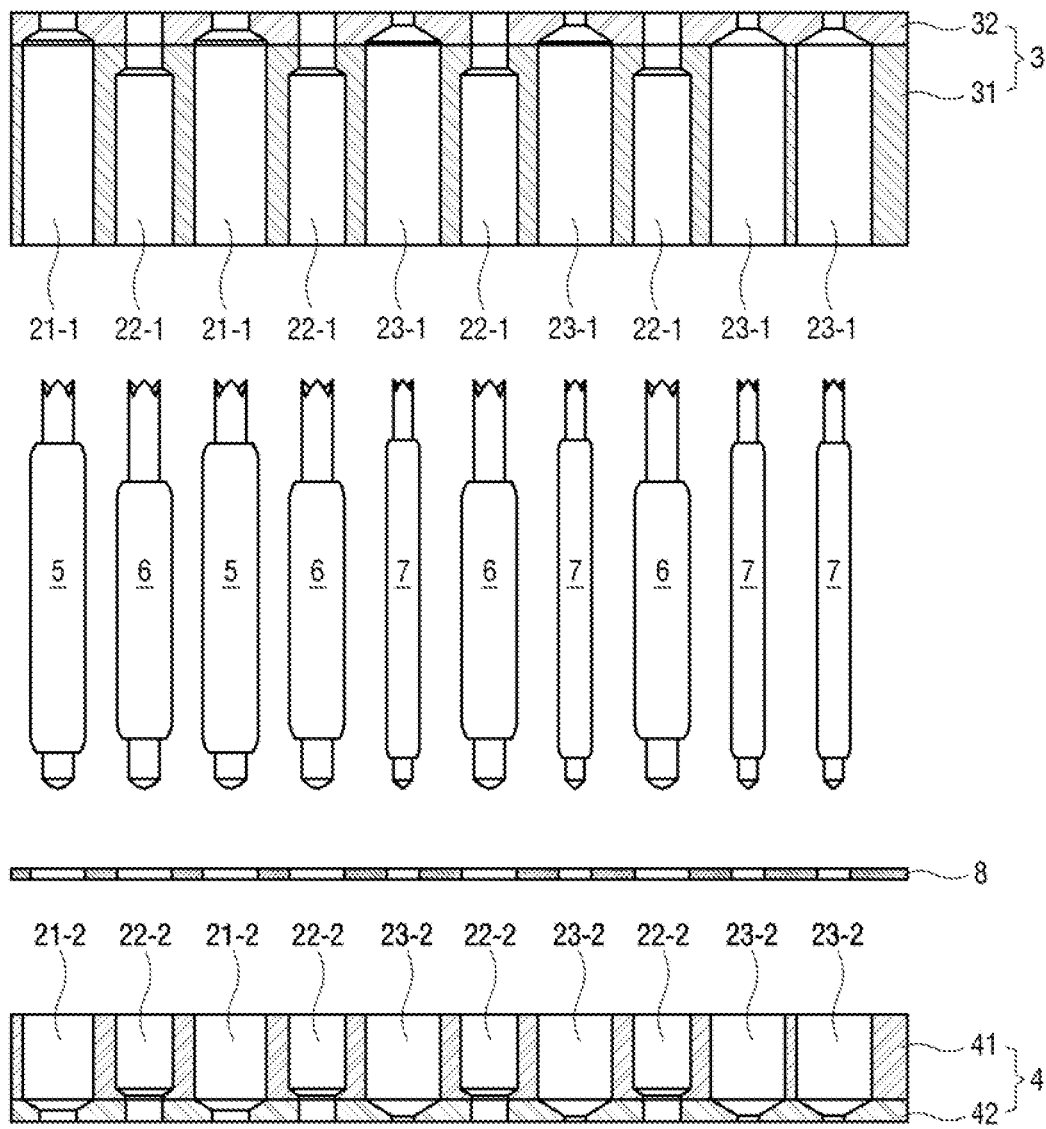

[Figure 7]
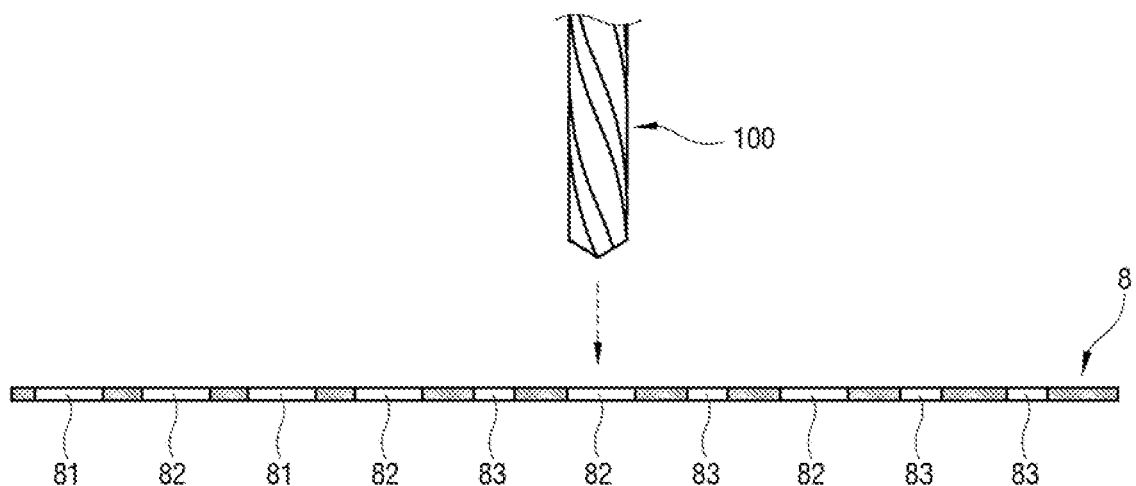
[Figure 8]
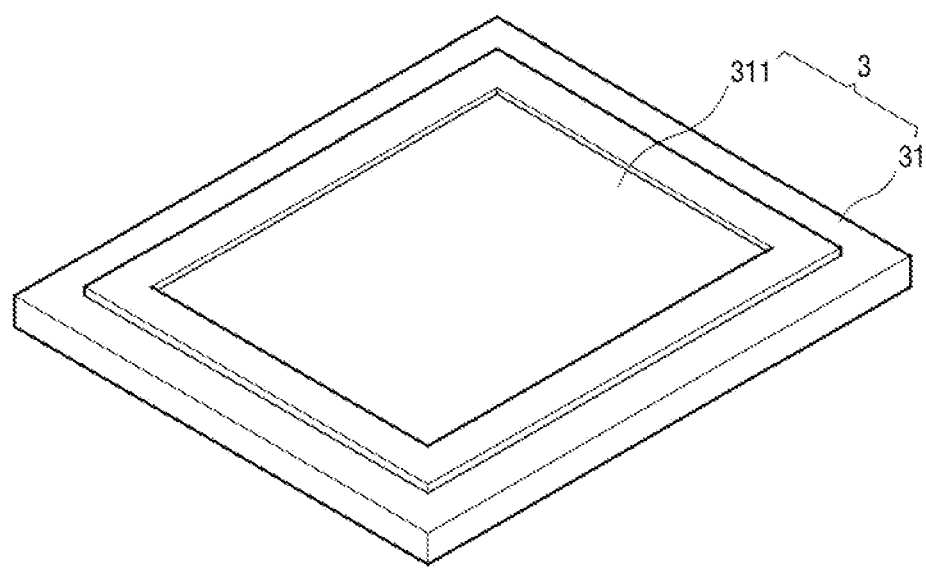

【Figure 9】
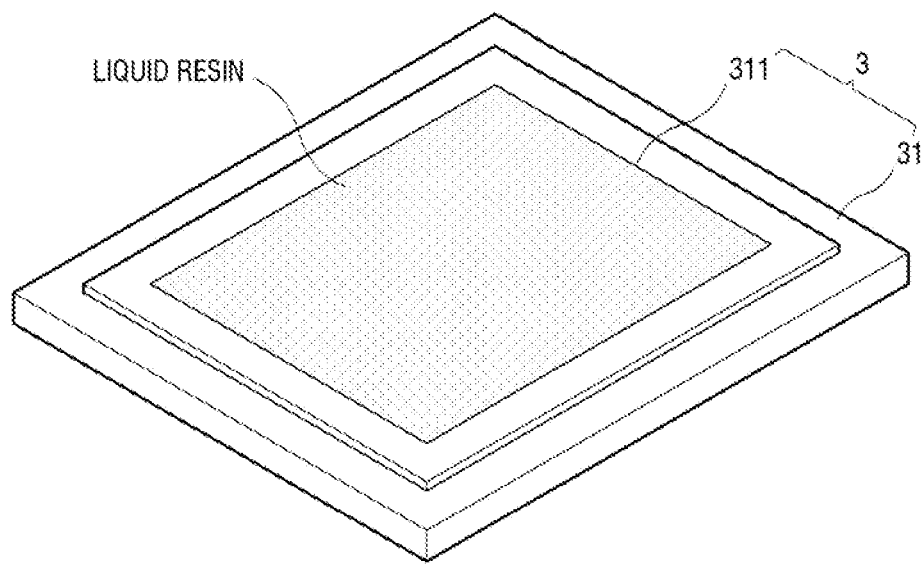
【Figure 10】
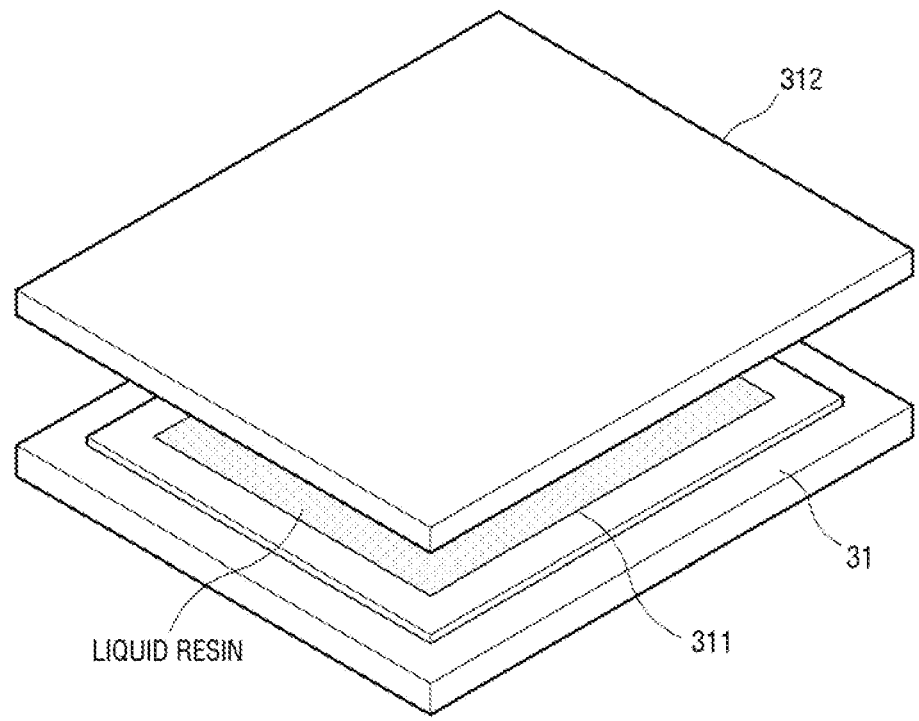

[Figure 11]
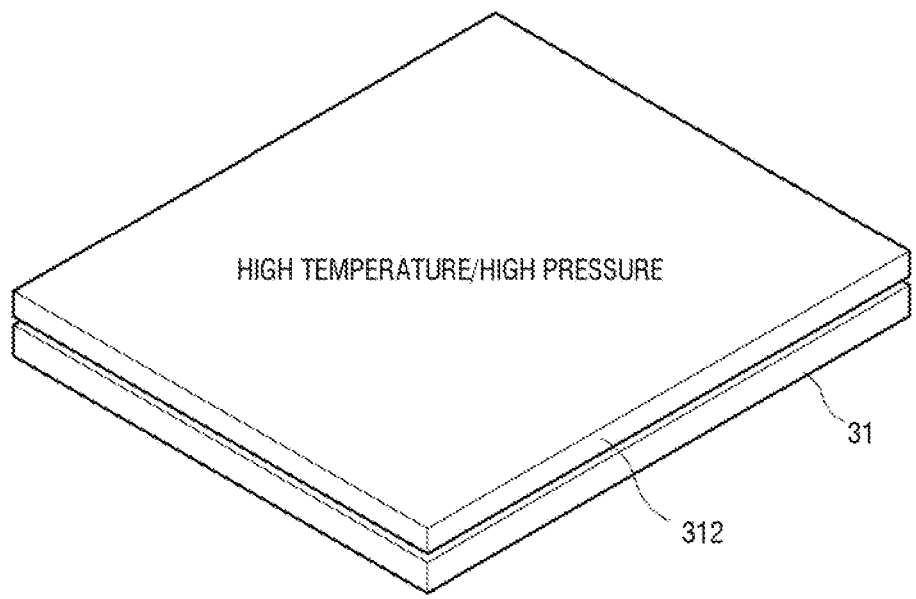
[Figure 12]
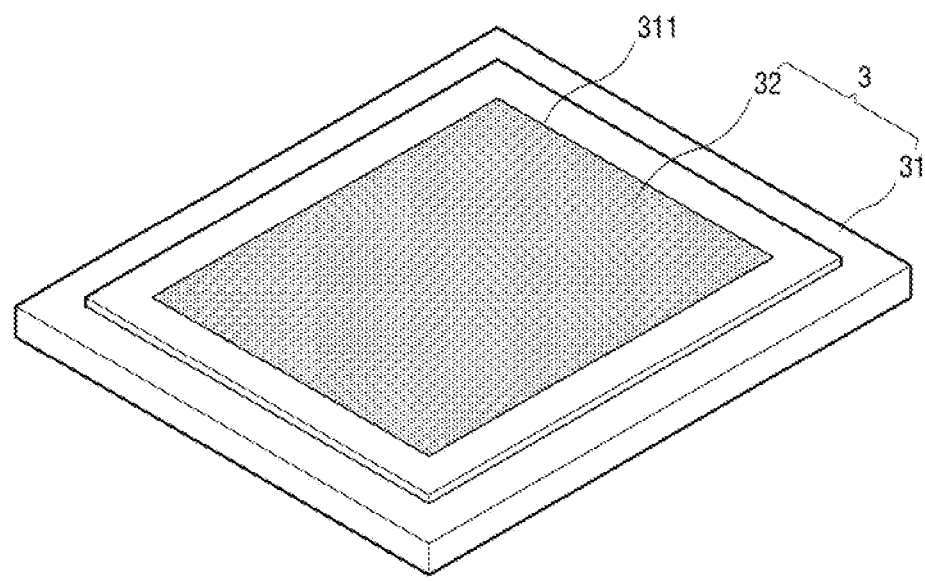

【Figure 13】
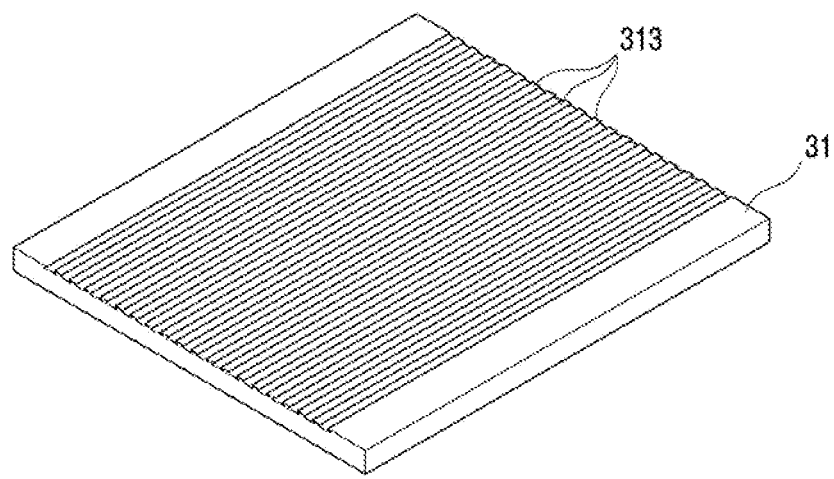
【Figure 14】
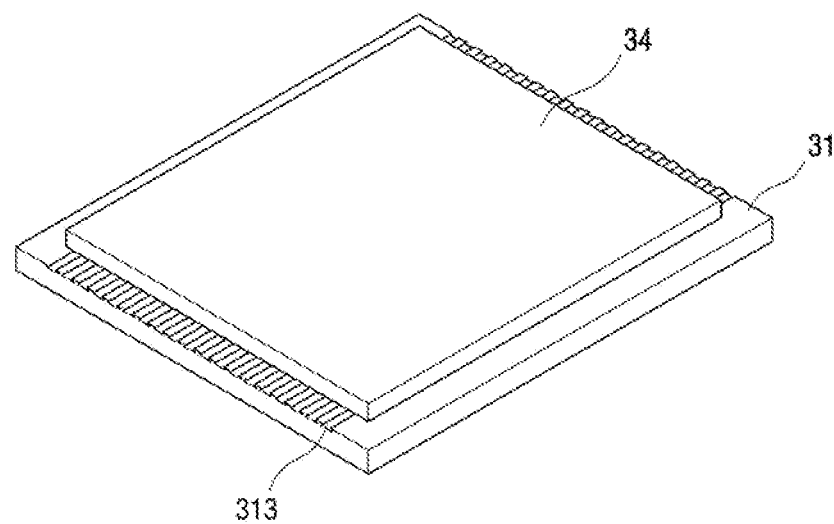

【Figure 15】
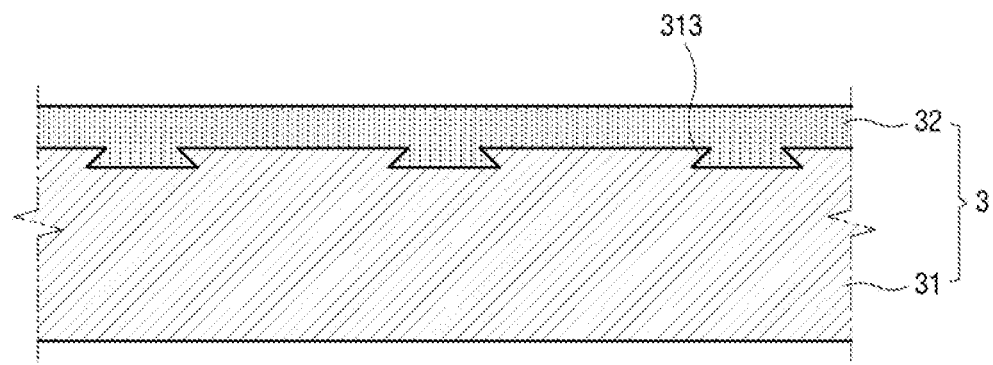
【Figure 16】
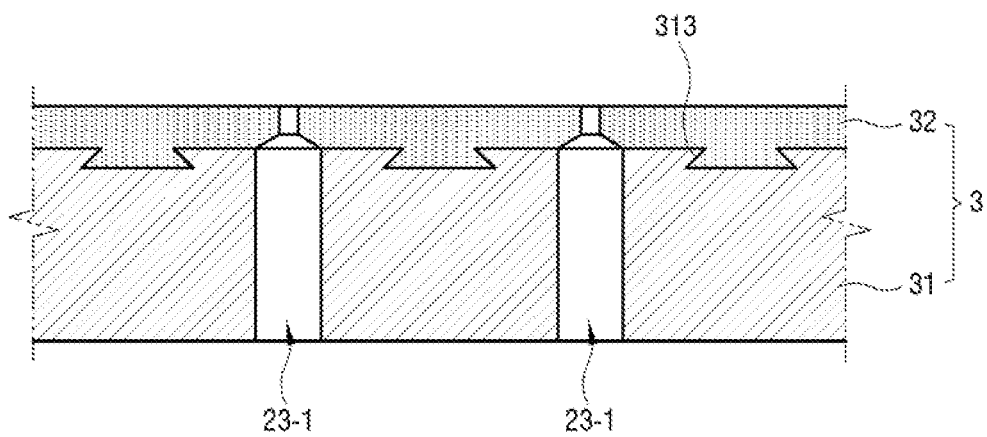

【Figure 17】
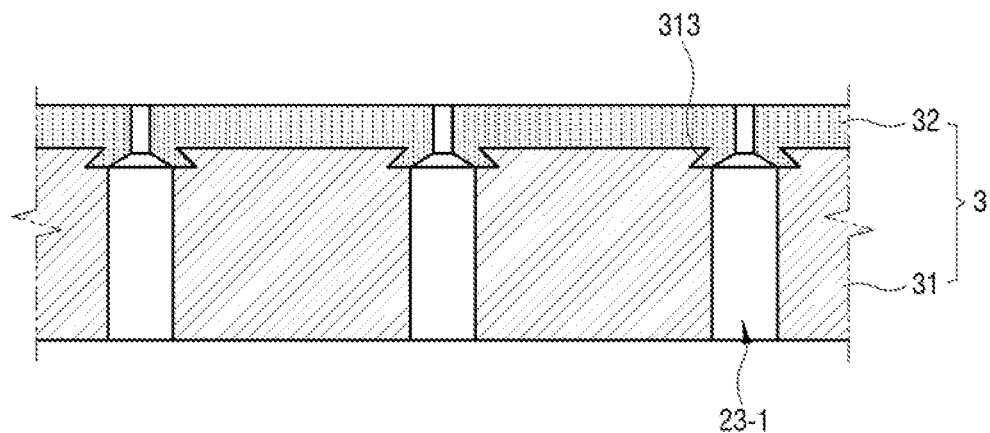
【Figure 18】
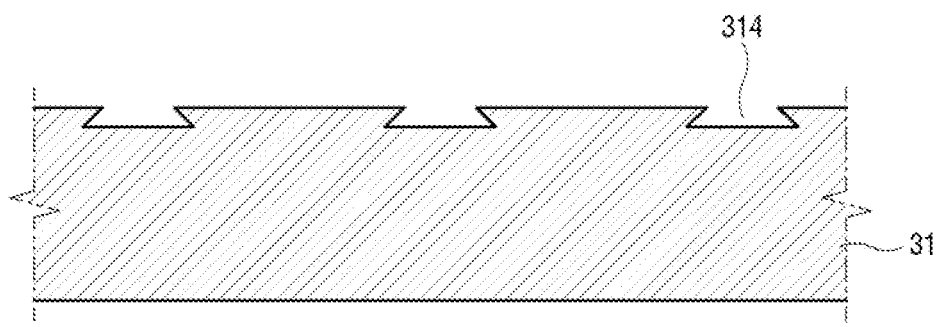
【Figure 19】
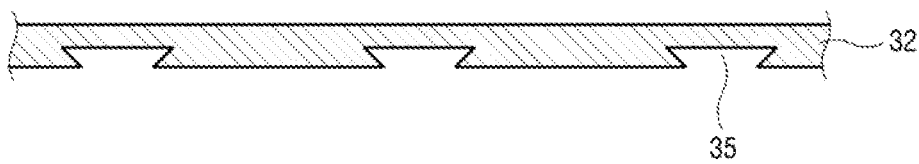

【Figure 20】
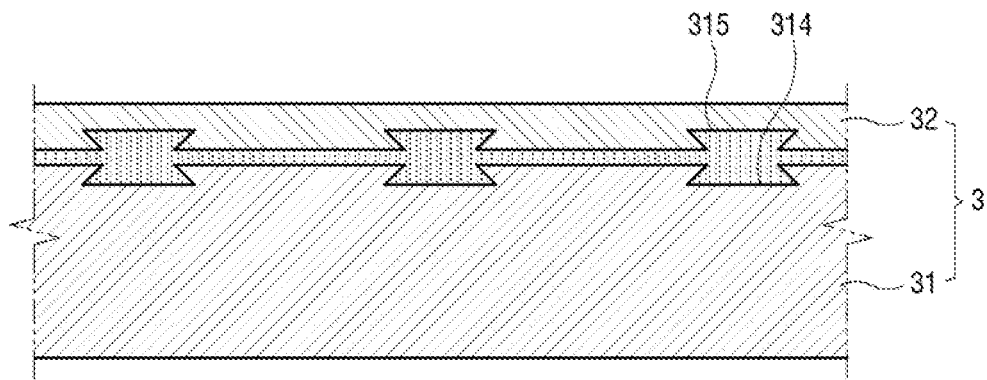
【Figure 21】
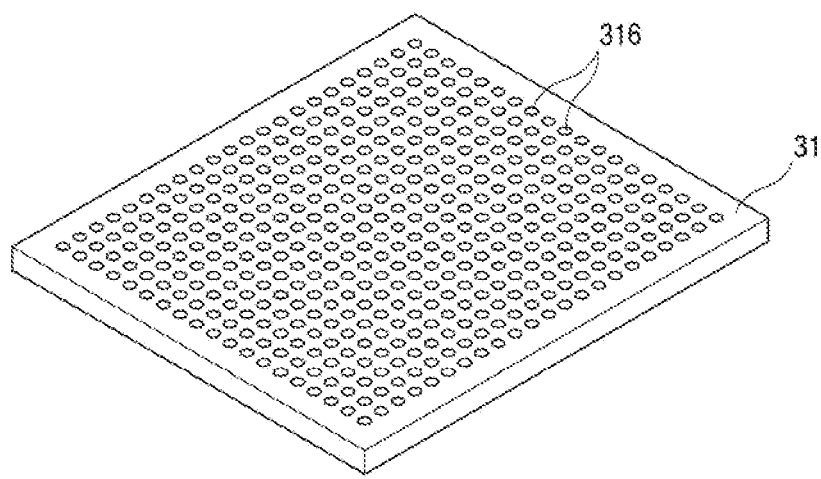

[Figure 22]
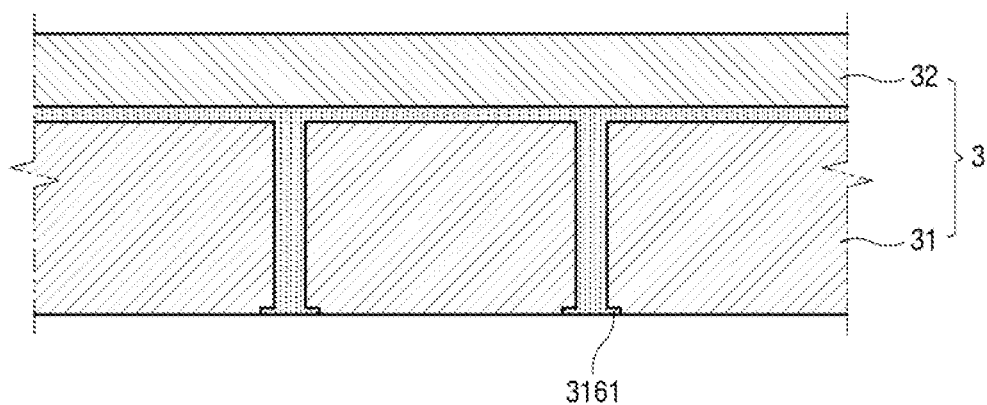

【Figure 23】
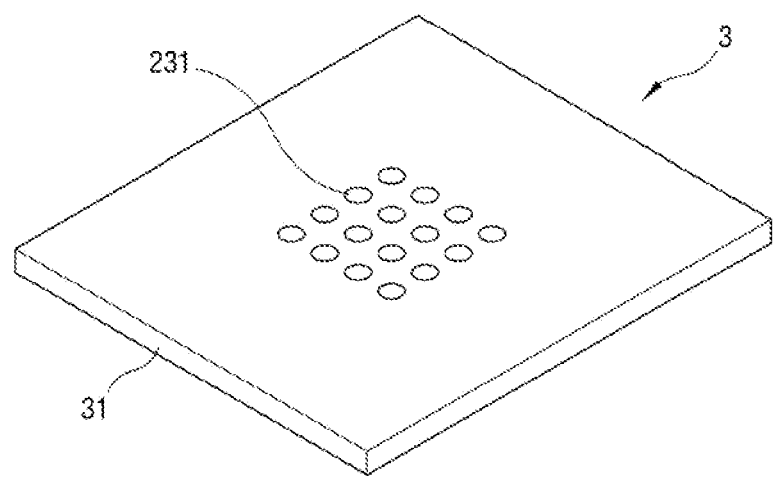
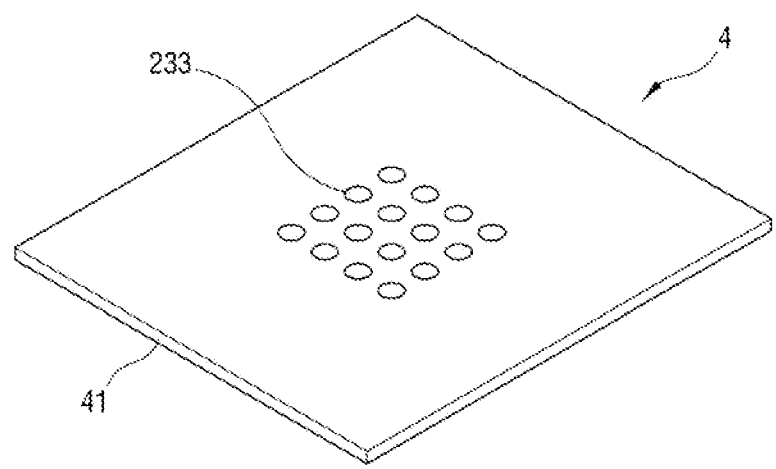

【Figure 24】
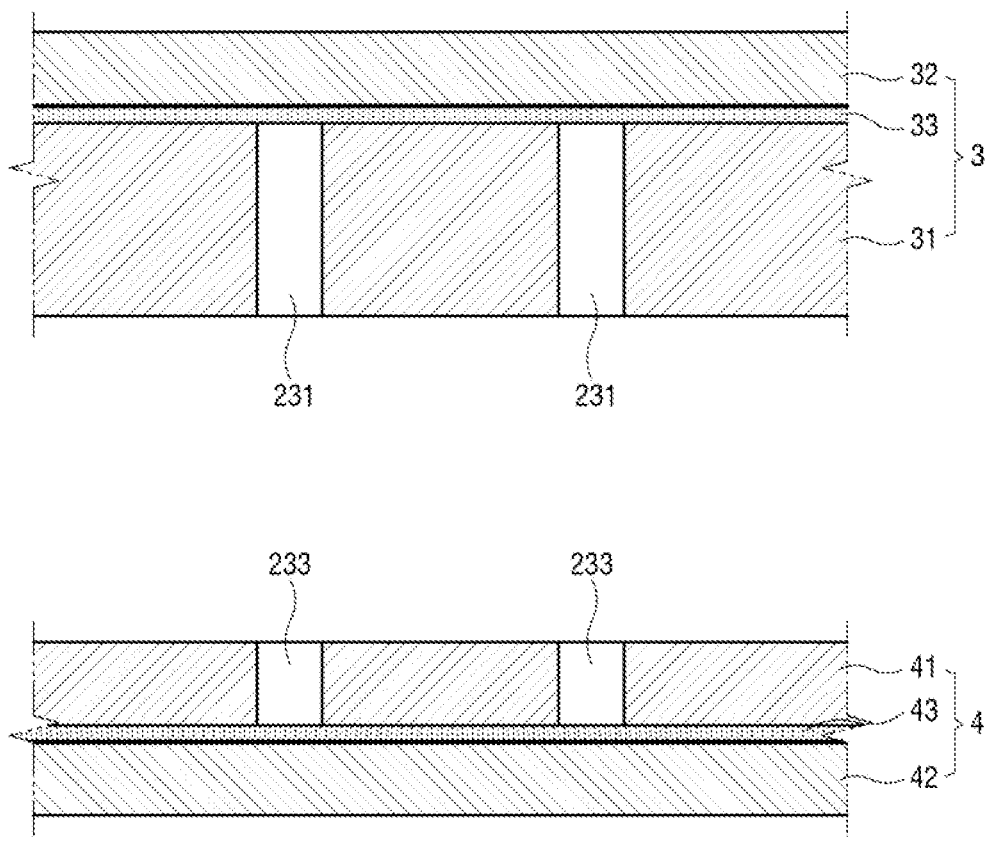

【Figure 25】
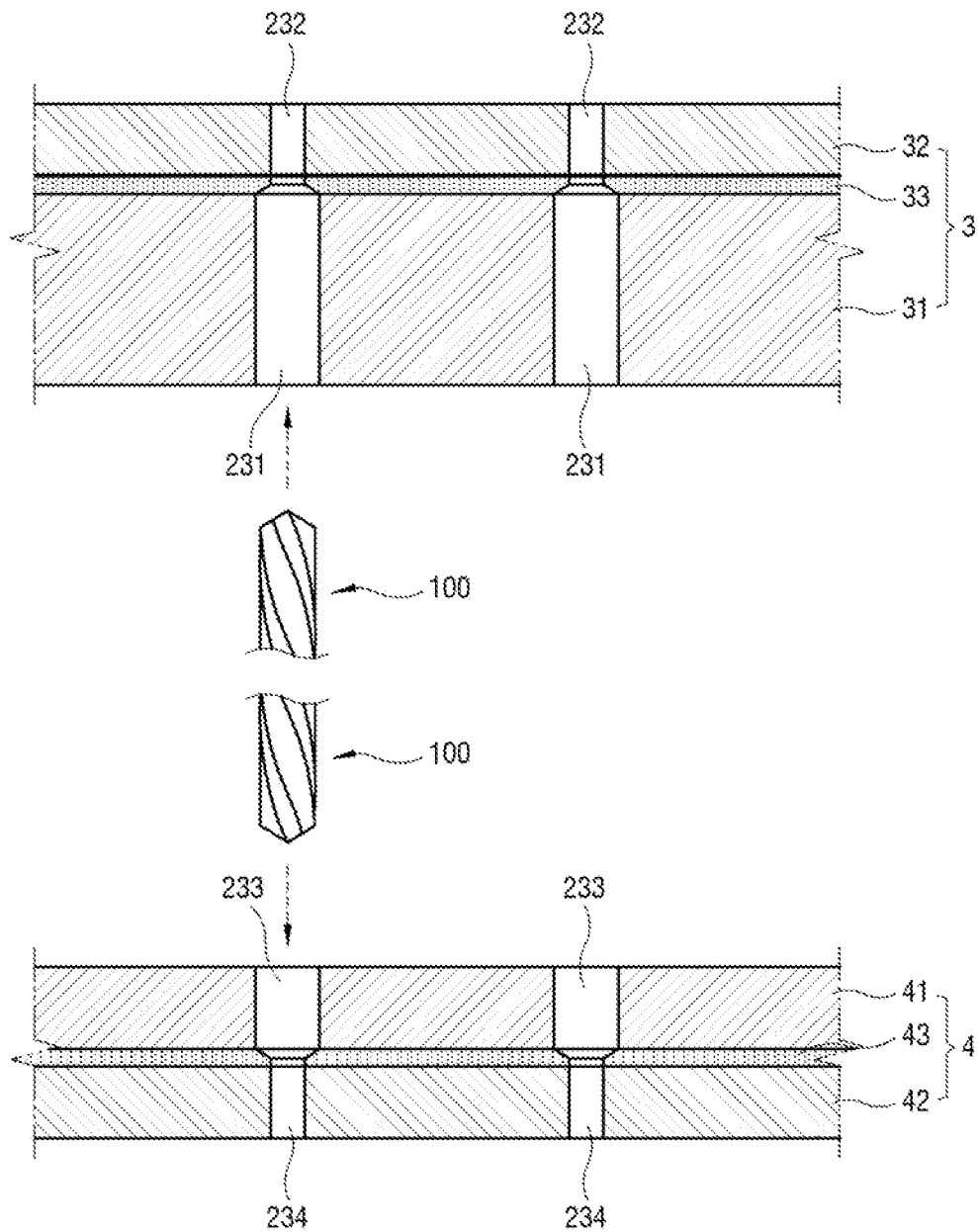

【Figure 26】
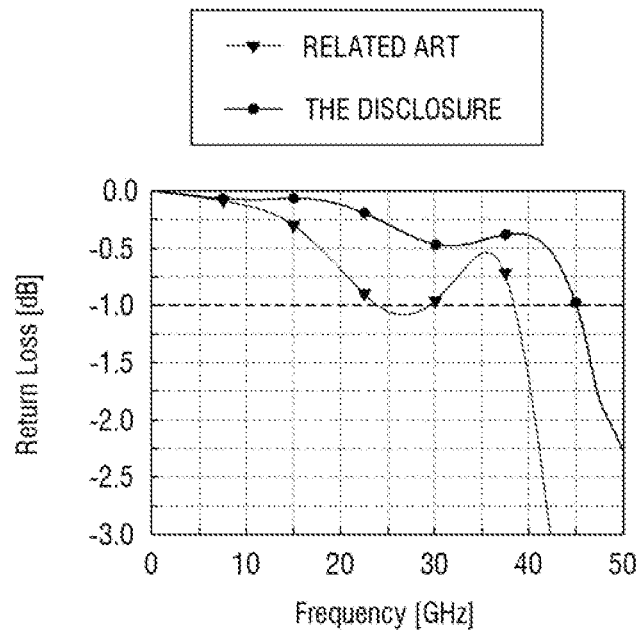
【Figure 27】
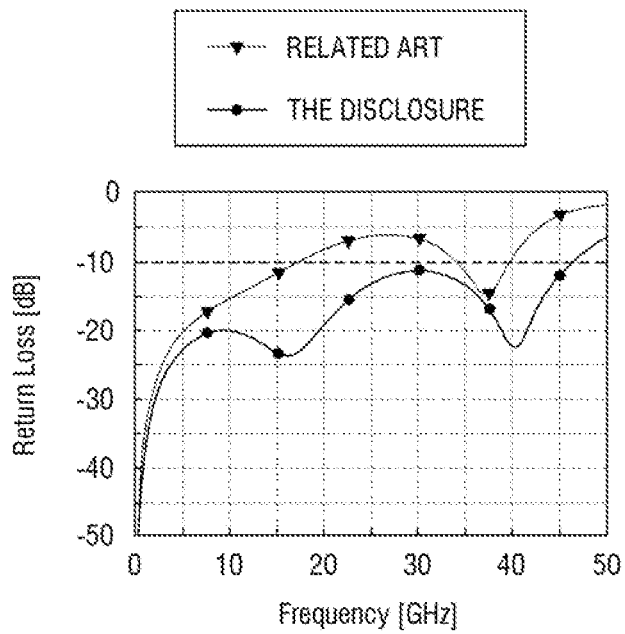

【Figure 28】
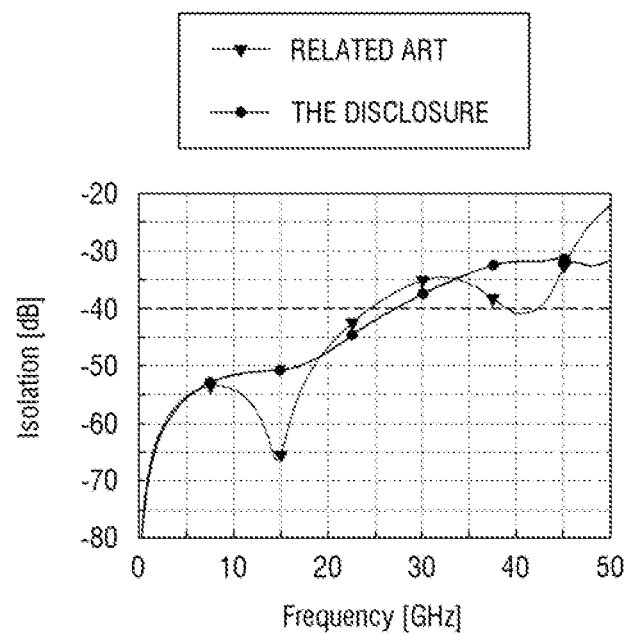
【Figure 29】
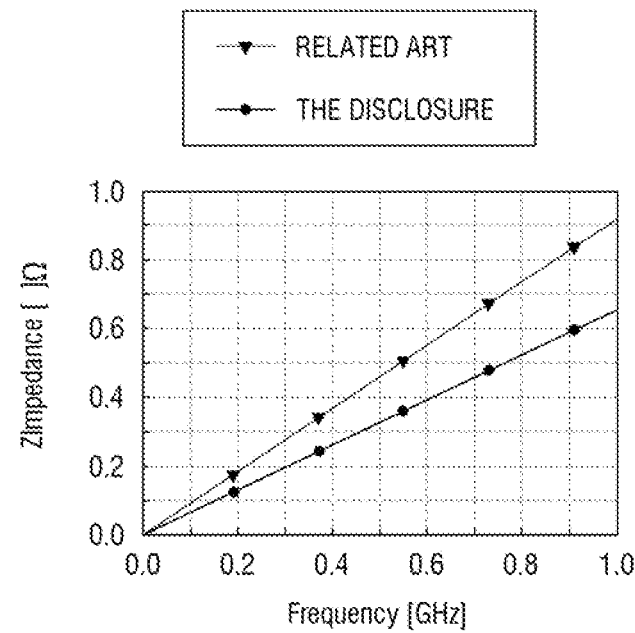

METHOD FOR FABRICATING TEST SOCKET

CROSS REFERENCE TO RELATED APPLICATIONS

This application is a National Stage of International Application No. PCT/KR2021/006238 filed May 18, 2021, claiming priority based on Korean Patent Application No. 10-2020-0061458 filed May 22, 2020.

TECHNICAL FIELD

The disclosure relates to a method of fabricating a test socket for testing electrical characteristics of a test object.

BACKGROUND ART

A test socket for high-frequency or high-speed semiconductor testing shields interference or noise between adjacent signal probes by attaching signal probes to a conductive block in a non-contact state. In a method of supporting the signal probe on the conductive block in the non-contact state, insulating support plates are disposed on both sides of the conductive block to support both end portions of the signal probe. At this time, after a probe accommodating hole for accommodating a barrel of the probe is formed in the conductive block and a probe supporting hole for supporting an end portion of the barrel is formed on the insulating support plate, the conductive block and the insulating support are joined so that the probe accommodating hole and the probe supporting hole are aligned. In the conventional method of fabricating a test socket, since the process of fabricating the probe accommodating hole and the process of fabricating the probe supporting hole are individually performed, as the number of probes increases, the process error and alignment error also increase. Therefore, the signal probes accommodated in and supported by the plurality of probe accommodating holes and the probe support holes deviate from central axes of the probe accommodating holes, and as a result, insertion loss characteristics, return loss characteristics, crosstalk characteristics or isolation characteristics, Z-Impedance characteristics, and inductance characteristics may deteriorate.

DISCLOSURE

Technical Problem

The disclosure is to provide a method of fabricating a test socket for high-frequency or high-speed semiconductor testing with excellent characteristics.

Technical Solution

In one general aspect, there is provided a method of fabricating a test socket that supports a probe stretchable in a longitudinal direction. The method of fabricating a test socket includes forming a plate-shaped first coupling block by joining a first base member made of a conductive material and a first insulating member made of an insulating material; forming a plate-shaped second coupling block by joining a second base member made of the conductive material and a second insulating member made of the insulating material; forming a first barrel accommodating hole for accommodating a part of the probe and a first support hole for supporting one end portion of the probe in the first coupling block; forming a second barrel accommodating hole for accommodating the rest of the probe and a first support hole for supporting the other end portion of the probe in the second coupling block; inserting one end of the probe into the first barrel accommodating hole to be supported on the first support hole, and inserting the other end of the probe into the second barrel accommodating hole to be supported on the second support hole; and joining the first coupling block and the second coupling block.

The forming of the first coupling block may include: arranging a first adhesive sheet between the first base member and the first insulating member; and heating and pressing the first adhesive sheet, and the forming of the second coupling block may include: arranging a second adhesive sheet between the second base member and the second insulating member; and heating and pressing the second adhesive sheet.

The first adhesive sheet and the second adhesive sheet may include a curable adhesive.

The first base member and the second base member may have different thicknesses.

The forming of the first coupling block may include forming a first depressed portion on one surface of the first base member; filling the first depressed portion with a resin; covering the first depressed portion filled with the resin with a first cover; curing the resin; and separating the first cover.

The forming of the second coupling block may include: forming a second depressed portion on one surface of the second base member; filling the second depressed portion with a resin; covering the second depressed portion filled with the resin with a second cover; curing the resin; and separating the second cover.

The forming of the first coupling block and the second coupling block may include insert-injecting the first insulating member and the second insulating member into the first and second base members, respectively.

The first base member and the second base member may each include a first coupling groove and a second coupling groove on surfaces on which the first insulating member and the second insulating member are formed.

Cross-sectional areas of the first coupling groove and the second coupling groove may be widened toward a floor.

The first coupling groove and the second coupling groove may each be formed by being excluded from an area in which the first barrel accommodating hole and the second barrel accommodating hole are provided.

The first coupling groove and the second coupling groove may each surround the first barrel accommodating hole and the second barrel accommodating hole.

The first base member and the second base member may each include a first coupling hole and a second coupling hole penetrating in a thickness direction.

The first coupling hole and the second coupling hole each may be excluded from an area in which the first barrel accommodating hole and the second barrel accommodating hole are provided.

The method of fabricating a test socket may further include: interposing a gap plate between the first coupling block and the second coupling block.

In one general aspect, there may be provided a method of fabricating a test socket that supports a probe stretchable in a longitudinal direction. The method of fabricating a test socket includes: forming a first barrel accommodating hole for accommodating a part of the probe in a first base member made of a conductive material, and forming a first coupling block by joining the first base member and a first insulating member made of an insulating material; forming a second barrel accommodating hole for accommodating the rest of the probe in a second base member made of the conductive material, and forming a second coupling block by joining the second base member and a second insulating member made of the insulating material; forming a first support hole for supporting one end portion of the probe in the first insulating member of the first coupling block through the first barrel accommodating hole; forming a second support hole for supporting the other end portion of the probe in the second insulating member of the second coupling block through the second barrel accommodating hole; inserting one end of the probe into the first barrel accommodating hole to support the first support hole, and inserting the other end of the probe into the second barrel accommodating hole to support the second support hole; and joining the first coupling block and the second coupling block.

The test socket fabricated by the above-described method may be provided.

Advantageous Effects

In the method of manufacturing an test socket according to an embodiment of the present invention, after the base member and the insulating member are integrally bonded to forma coupling block, the probe accommodating hole and the probe supporting hole for accommodating the signal probes are formed in a single process. As a result, alignment or process error can be reduced so that the signal probe can be accurately positioned along the central axis of the probe accommodating hole, and hereby insertion loss, return loss, crosstalk or isolation, Z-impedance and inductance characteristics can be improved.

DESCRIPTION OF DRAWINGS

FIG. 1 is a cross-sectional view illustrating a test socket according to a first embodiment of the disclosure.

FIG. 2 is a cross-sectional view illustrating a socket block of FIG. 1.

FIGS. 3 to 6 are diagrams illustrating a method of manufacturing a test socket of FIG. 1.

FIG. 7 is a cross-sectional view illustrating a gap plate of FIG. 2.

FIGS. 8 to 12 are diagrams illustrating a method of fabricating a first coupling block according to a second embodiment of the disclosure.

FIGS. 13 to 15 are diagrams illustrating a method of fabricating a first coupling block according to a third embodiment of the disclosure.

FIGS. 16 and 17 are diagrams illustrating a method of forming a first signal probe hole in a first coupling block illustrated in FIG. 15.

FIGS. 18 to 20 are diagrams illustrating a method of fabricating a joined first coupling block according to a fourth embodiment of the disclosure.

FIGS. 21 and 22 are diagrams illustrating the joined first coupling block according to a fifth embodiment of the disclosure.

FIGS. 23 to 24 are diagrams illustrating a method of fabricating a test socket according to a sixth embodiment of the disclosure.

FIGS. 25 to 29 are graphs illustrating a comparison between insertion loss, return loss, isolation and Z-impedance characteristics of the related art and the disclosure.

BEST MODE

Hereinafter, exemplary embodiments according to the disclosure will be described in detail with reference to the drawings.

FIG. 1 is a cross-sectional view illustrating a test socket 1 according to a first embodiment of the disclosure.

Referring to FIG. 1, the test socket 1 includes a socket block 2 and a plurality of probes such as a power probe 5, a ground probe 6, a signal probe, or an RF probe 7 (hereinafter, referred to as 'signal probe'). The test socket 1 includes any one or two of the power probe 5, the ground probe 6, and the signal probe 7.

The socket block 2 includes a first coupling block 3 and a second coupling block 4.

The first coupling block 3 may be formed by integrally joining a first insulating member 32 to one surface of the first base member 31.

The first base member 31 may be made of a conductive material, for example, brass or the like. The first base member 31 may be formed by coating an insulating material with a conductive material.

The first insulating member 32 may be made of an insulating material, for example, engineering plastic, ceramic, or the like.

The second coupling block 4 may be formed by integrally joining a second insulating member 42 to one surface of the second base member 41.

The second base member 41 may be made of a conductive material, for example, brass or the like. The second base member 41 may be formed by coating an insulating material with a conductive material. The second base member 41 may have a thickness smaller than that of the first base member 31.

The second insulating member 42 may be made of an insulating material, for example, engineering plastic, ceramic, or the like.

The power probe 5 is accommodated in a non-contact state with the first and second base members 31 and 41, and one end portion thereof may be supported by the first insulating member 32 and the other end portion thereof may be supported by the second insulating member 42. The power probe 5 includes a barrel 51, a first plunger 52, a second plunger 53, and a spring (not illustrated). The first plunger 52 and the second plunger 53 can be stretched along the longitudinal direction with a spring interposed therebetween, and may partially protrude from upper and lower surfaces of the socket block 2 to electrically connect between a power contact of a test object and a power contact of an inspection circuit board.

The ground probe 6 may be supported in a contact state with the first and second base members 31 and 41 and may be supported so that both end portions thereof pass through the first and second insulating members 32 and 42. The ground probe 6 includes a barrel 61, a first plunger 62, a second plunger 63, and a spring (not illustrated). The first plunger 62 and the second plunger 63 can be stretched along the longitudinal direction with a spring interposed therebetween, and may partially protrude from upper and lower surfaces of the socket block 2 to electrically connect between a ground contact of the test object and a ground contact of the inspection circuit board.

The signal probe 7 is accommodated in a non-contact state with the first and second base members 31 and 41, and one end portion thereof may be supported by the first insulating member 32 and the other end portion thereof may be supported by the second insulating member 42. The signal probe 7 includes a barrel 71, a first plunger 72, a second plunger 73, and a spring (not illustrated). The first plunger 72 and the second plunger 73 can be stretched along the longitudinal direction with a spring interposed therebetween, and may partially protrude from upper and lower surfaces of the socket block 2 to electrically connect between a signal contact of the test object and a signal contact of the inspection circuit board.

A gap plate 8 for aligning the positions of the plurality of probes 5, 6, and 7 is provided between the first coupling block 3 and the second coupling block 4.

The gap plate 8 includes a power hole 81, a ground hole 82, and a signal hole 83 corresponding to the outer diameters of the barrels 51, 61, and 71 of the power probe 5, the ground probe 6, and the signal probe 7.

The gap plate 8 may be made of an insulating material, for example, engineering plastic, ceramic, or the like. The gap plate 8 may correct an alignment error when the first coupling block 3 and the second coupling block 4 are joined.

The power probe 5, the ground probe 6, and the signal probe 7 are not limited to a pogo type described above, but any probe that can be stretched may be applied.

FIG. 2 is a cross-sectional view illustrating a socket block 2 of FIG. 1.

Referring to FIG. 2, the socket block 2 includes a power probe hole 21 for accommodating the power probe 5 in a non-contact state, a ground probe hole 22 for accommodating the ground probe 6 in a contact state, and a signal probe hole 23 for accommodating the signal probe 7 in a non-contact state.

The power probe hole 21 includes first and second power probe holes 21-1 and 21-2 formed in the first and second coupling blocks 3 and 4, respectively.

The first power probe hole 21-1 includes a first power probe accommodating hole 211 formed in the first base member 31 to accommodate a part of the power probe 5 in a non-contact state, and a first power probe support hole 212 formed in the first insulating member 32 to support one end portion of the power probe 5.

The second power probe hole 21-2 includes a second power probe accommodating hole 213 formed in the second base member 41 to accommodate the rest of the power probe 5 in a non-contact state, and a second power probe support hole 214 formed in the second insulating member 42 to support the other end portion of the power probe 5.

The first and second power probe accommodating holes 211 and 213 may be formed to vertically penetrate through the first and second base members 31 and 41 constantly with a diameter greater than an outer diameter of the barrel 51 of the power probe 5.

The first power probe support hole 212 includes a first barrel support groove 2121 formed in the first insulating member 32 in a shape corresponding to one end portion of the barrel 51 of the power probe 5, and a first plunger through hole 2122 communicating with the first barrel support groove 2121 and formed in the first insulating member 32 so that the first plunger 52 passes through the first plunger through hole 2122.

The second power probe support hole 214 includes a second barrel support groove 2141 formed in the second insulating member 42 in a shape corresponding to the other end portion of the barrel 51 of the power probe 5, and a second plunger through hole 2142 communicating with the second barrel support groove 2141 and formed in the second insulating member 42 so that the second plunger 53 passes through the second plunger through hole 2142.

The ground probe hole 22 includes first and second ground probe holes 22-1 and 22-2 formed in the first and second coupling blocks 3 and 4, respectively.

The first ground probe hole 22-1 includes a first ground probe accommodating hole 221 formed in the first base member 31 to accommodate a part of the ground probe 6 in a contact state, and a ground probe through hole 222 formed in the first insulating member 32 so that one end portion of the ground probe 6 passes through the ground probe through hole 222.

The second ground probe hole 22-2 includes a second ground probe accommodating hole 223 formed in the second base member 41 to accommodate the rest of the ground probe 6 in a contact state, and a ground probe through hole 224 formed in the second insulating member 42 so that the other end portion of the ground probe 6 passes through the ground probe through hole 224.

The first and second ground probe accommodating holes 221 and 223 includes first and second barrel accommodating holes 2211 and 2231 formed in the first and second base members 31 and 41, respectively, to constantly extend to the same diameter as the outer diameter of the barrel 61 of the ground probe 6, first and second barrel end accommodating grooves 2212 and 2232 formed in the first and second base members 31 and 41, respectively, to accommodate both end portions of the barrel 61 of the ground probe 6, and first and second plunger accommodating holes 2213 and 2233 formed in the first and second base members 31 and 41, respectively, to accommodate the first and second plungers 62 and 63 of the ground probe 6. The first and second barrel end accommodating grooves 2212 and 2232 and the first and second plunger accommodating holes 2213 and 2233 may be formed in the first and second insulating members 32 and 42, respectively.

The first and second ground probe through holes 222 and 224 may communicate with the first and second plunger accommodating holes 2213 and 2233, respectively, and may be formed in the first and second insulating members 32 and 42 so that the first and second plungers 62 and 63 of the ground probe 6 pass through the first and second ground probe through holes 222 and 224.

The signal probe hole 23 includes first and second signal probe holes 23-1 and 23-2 formed in the first and second coupling blocks 3 and 4, respectively.

The first signal probe hole 23-1 includes a first signal probe accommodating hole 231 formed in the first base member 31 to accommodate a part of the signal probe 7 in a non-contact state, and a first signal probe support hole 232 formed in the first insulating member 32 to support one end portion of the signal probe 7.

The second signal probe hole 23-2 includes a second signal probe accommodating hole 233 formed in the second base member 41 to accommodate the rest of the signal probe 7 in a non-contact state, and a second signal probe support hole 234 formed in the second insulating member 42 to support the other end portion of the signal probe 7.

The first and second signal probe accommodating holes 231 and 233 may be formed to vertically penetrate through the first and second base members 31 and 41 constantly with a diameter greater than an outer diameter of the barrel 71 of the signal probe 7.

The first signal probe support hole 232 includes a first barrel support groove 2321 formed in the first insulating member 32 in a shape corresponding to one end portion of the barrel 71 of the signal probe 7, and a first plunger through hole 2322 communicating with the first barrel support groove 2321 and formed in the first insulating member 32 so that the first plunger 72 passes therethrough.

The second signal probe support hole 234 includes a second barrel support groove 2341 formed in the second insulating member 42 in a shape corresponding to the other end portion of the barrel 71 of the signal probe 7, and a second plunger through hole 2342 communicating with the second barrel support groove 2341 and formed in the second insulating member 42 so that the second plunger 73 passes through the second plunger through hole 2341.

As a modified embodiment, the second coupling block 4 may be applied in the same manner as the structure of the first coupling block 3.

FIGS. 3 to 6 are diagrams illustrating the method of fabricating a test socket 1 of FIG. 1.

As illustrated in FIG. 3, the insulating member 32 adheres to the upper surface of the base member 31 by using an adhesive sheet 33. Similarly, the second insulating member 42 adheres to the lower surface of the second base member 41 by using the adhesive sheet 33. Here, the adhesive sheet 33 may include, for example, a thermosetting epoxy resin adhesive.

As illustrated in FIG. 4, for example, by applying a pressure of 1 kf/cm2 for about 80 minutes in an atmosphere of 170° C., the first base member 31 and the first insulating member 32, and the second base member 41 and the second insulating member 42 are joined to form the first coupling block 3 and the second coupling block 4, respectively.

As illustrated in FIG. 5, the first power probe hole 21-1, the first ground probe hole 22-1, and the first signal probe hole 23-1 are formed in the first coupling block 3 by, for example, a drill 100. The second power probe hole 21-2, the second ground probe hole 22-2, and the second signal probe hole 23-2 are formed in the second coupling block 4 by, for example, the drill 100.

As illustrated in FIG. 6, the power probe 5, the ground probe 6, and the signal probe 7 are inserted into the first and second power probe holes 21-1 and 21-2, the first and second ground probe holes 22-1 and 22-2, and the first and second signal probe holes 23-1 and 23-2, respectively, and then, the first coupling block 3 and the second coupling block 4 are joined by, for example, a bolt or a screw (not illustrated).

As described above, since the first signal probe hole 23-1 in the first coupling block 3 are drilled in a single process, the alignment error and process error may be reduced even when a large number of signal probe holes 23 are formed in the test socket 1. Similarly, since the second signal probe hole 23-2 in the second coupling block 4 are drilled in a single process, the alignment error and process error may be reduced even when a large number of signal probe holes 23 are formed in the test socket 1. Therefore, the signal probe 7 may be supported to fit a central axis of the signal probe hole 23, and as a result, insertion loss, return loss, crosstalk or isolation, Z-impedance, and inductance characteristics may be improved.

FIG. 7 is a cross-sectional view illustrating the gap plate 8 of FIG. 2.

As illustrated in FIG. 7, the gap plate 8 made of the insulating material is formed with a power hole 81, a ground hole 82, and a signal hole 83 corresponding to each outer diameter of the barrel 51 of the power probe 5, the barrel 61 of the ground probe 6, and the barrel 71 of the signal probe 7 by, for example, the drill 100. As described above, the gap plate 8 thus formed may be interposed between the first coupling block 3 and the second coupling block 4 as illustrated in FIG. 2.

Hereinafter, a method of fabricating a first coupling block 3 will be described in detail. Since the method of fabricating a second coupling block 4 is similar to the method of fabricating a first coupling block 3, a description thereof will be omitted.

FIGS. 8 to 12 are diagrams illustrating a method of fabricating a first coupling block 3 according to a second embodiment of the disclosure.

As illustrated in FIG. 8, for example, a depressed portion 311 is formed in the predetermined area is formed on the upper surface of the base member 31 made of brass.

As illustrated in FIG. 9, for example, the depressed portion 311 of the base member 31 is filled with a liquid resin, for example, an epoxy resin.

As illustrated in FIG. 10, a cover 312 is covered over the depressed portion 311 of the base member 31 filled with the epoxy resin.

As illustrated in FIG. 11, the epoxy resin filled in the depressed portion 311 of the base member 31 is cured by being applied with a pressure of, for example, 1 kf/cm2 for about 80 minutes in an atmosphere of, for example, 170° C.

As illustrated in FIG. 12, the cover 312 is removed to complete the first coupling block 3.

FIGS. 13 to 15 are diagrams illustrating a method of fabricating a first coupling block 3 according to a third embodiment of the disclosure.

As illustrated in FIG. 13, a plurality of coupling grooves 313 are formed on the upper surface of the first base member 31. In this case, the coupling groove 313 has a shape in which a cross-sectional area widens toward a bottom and may extend parallel to the first base member 31 at intervals.

As illustrated in FIG. 14, after positioning a mold cover 34 so as to cover the coupling groove 313 formed on the upper surface of the base member 31, the injection molding is performed by putting an injection material between the first base member 31 and the mold cover 34 and into the coupling groove 313, so the firmly joined first coupling block 3 may be formed. The injection molding may be performed, for example, at a pressure of 160 kf/cm2 and at 430° C. for 3.5 seconds.

As illustrated in FIG. 15, the first coupling block 3 which the insulating member 32 is firmly joined on the upper surface of the first base member 31 may be formed.

FIGS. 16 and 17 are diagrams illustrating a method of forming a first signal probe hole 23-1 in the first coupling block illustrated in FIG. 15.

As illustrated in FIG. 16, the first signal probe hole 23-1 may be formed in the area where the coupling groove 313 is not formed.

As illustrated in FIG. 17, the first signal probe hole 23-1 may be formed in the area where the coupling groove 313 is formed.

By considering the fact that the position where the signal probe hole 23 (FIG. 2) is formed in the test socket 1 differs depending on the position of the signal contact of the test object to be tested, it may be determined whether the signal probe hole 23 is formed in the area where the coupling groove 313 is formed or not.

FIGS. 18 to 20 are diagrams illustrating a method of fabricating a first coupling block 3 according to a fourth embodiment of the disclosure.

As illustrated in FIG. 18, a plurality of first coupling grooves 314 is formed on the upper surface of the first base member 31. In this case, the first coupling groove 314 may extend in parallel with the first base member 31 at an intervals.

As illustrated in FIG. 19, a second coupling groove 315 is formed on the lower surface of the insulating member 32.

As illustrated in FIG. 20, the lower surface of the first insulating member 32 is disposed on the upper surface of the first base member 31 so that the first coupling groove 314 and the second coupling groove 315 face each other. Thereafter, the injection molding is performed by putting the injection material between the first base member 31 and the first insulating member 32 and into the first coupling groove 314 and the second coupling groove 315, so the firmly joined coupling block 3 may be formed.

FIGS. 21 and 22 are diagrams illustrating the first coupling block 3 according to a fifth embodiment of the disclosure.

As illustrated in FIG. 21, a plurality of coupling holes 316 extending to penetrate from the upper surface to the lower surface of the first base member 31 may be formed.

As illustrated in FIG. 22, after positioning the first insulating member 32 so as to cover the coupling hole 316 formed on the upper surface of the base member 31, the injection molding may be performed by putting an injection material between the first base member 31 and the first insulating member 32 and into the coupling hole 316, so the firmly joined first coupling block 3 may be formed. The injection molding may be performed, for example, at a pressure of 160 kf/cm2 and at 430° C. for 3.5 seconds. The coupling hole 316 may include an extension part 3161 extending radially at the bottom.

FIGS. 23 to 25 are diagrams illustrating a method of fabricating a test socket 1 according to a sixth embodiment of the disclosure.

As illustrated in FIG. 23, the first signal probe accommodating hole 231 is formed in the first base member 31 of the first coupling block 3 by using, for example, the drill 100. The second signal probe accommodating hole 233 is formed in the second base member 41 of the second coupling block 4 by using, for example, the drill 100.

As illustrated in FIG. 24, the insulating member 32 adheres to the upper surface of the base member 31 by using an adhesive sheet 33. Likewise, the second insulating member 42 adheres to the lower surface of the second base member 41 by using the adhesive sheet 33. Here, the adhesive sheet 33 may include, for example, a thermosetting epoxy resin adhesive. Thereafter, for example, by applying a pressure of 1 kf/cm2 for about 80 minutes in an atmosphere of 170° C., the first base member 31 and the first insulating member 32, and the second base member 41 and the second insulating member 42 are joined to form the first coupling block 3 and the second coupling block 4, respectively.

As illustrated in FIG. 25, the first signal probe support hole 232 for supporting one end of the signal probe 7 is formed in the first insulating member 32 through the first signal probe accommodating hole 231 by using, for example, the drill 100. Similarly, the second signal probe support hole 234 for supporting the other end of the signal probe 7 is formed in the second insulating member 42 through the second signal probe accommodating hole 233 by using, for example, the drill 100.

Thereafter, after inserting the signal probe 7 into the signal probe hole 23, the first coupling block 3 and the second coupling block 4 may be joined to complete the test socket 1.

FIGS. 26 to 29 are graphs showing a comparison of insertion loss characteristics, return loss characteristics, isolation characteristics, and Z-impedance characteristics of the test socket 1 according to the related art and the disclosure.

It is preferable that the insertion loss is ideally zero. Referring to FIG. 26, it can be seen that, based on the allowable insertion loss (−1.0 dB), the related art exceeds the standard at about 22.0 GHz, while the disclosure shows a very good insertion loss characteristics at about 45.2 GHz.

It is preferable that the return loss is as small as possible. Referring to FIG. 27, it can be seen that, based on the allowable return loss (−10.0 dB), the related art exceeds the reference at about 17.1 GHz, while the disclosure shows a very good return loss characteristics at about 46.5 GHz.

It is preferable that the isolation characteristics are as small as possible. Referring to FIG. 28, it can be seen that based on the allowable isolation characteristics (−40 dB), the prior art exceeds the allowable isolation characteristic (−40 dB) at about 24.4 GHz, while the disclosure is about 27.0 GHz, which is somewhat superior and shows little change.

It is preferable that the Z-Impedance is as small as possible. Referring to FIG. 29, it can be seen that, based on an allowable Z-impedance (1 GHz), the prior art represents about 0.9Ω, while the disclosure is about 0.65Ω, which is more excellent.

According to the method of fabricating a test socket according to the embodiment of the disclosure, since the coupling block is formed by integrally joining the base member and the insulating member, and then the probe accommodating hole for accommodating the signal probes and the probe support hole are formed in a single process, the process error or the alignment error may be reduced, so the signal probe may be located on the central axis of the probe accommodating hole, thereby improving insertion loss, return loss, crosstalk or isolation, Z-impedance, and inductance characteristics.

In the foregoing specification, the disclosure and its advantages have been described with reference to specific embodiments. However, it will be apparent to those of ordinary skill in the art that various modifications and changes can be made without departing from the scope of the disclosure as set forth in the claims below. Accordingly, the specification and drawings should be regarded as an example of the disclosure rather than a limitation. All these possible modifications should be made within the scope of the disclosure.

The invention claimed is:

1. A method of fabricating a test socket that supports a probe stretchable in a longitudinal direction, the method comprising:
   forming a first coupling block by joining a first base member made of a conductive material and a first insulating member made of an insulating material;
   forming a second coupling block by joining a second base member made of the conductive material and a second insulating member made of the insulating material;
   forming a first barrel accommodating hole for accommodating a part of the probe and a first support hole for supporting one end portion of the probe in the first coupling block;
   forming a second barrel accommodating hole for accommodating the rest of the probe and a second support hole for supporting the other end portion of the probe in the second coupling block;
   inserting one end of the probe into the first barrel accommodating hole to be supported on the first support hole, and inserting the other end of the probe into the second barrel accommodating hole to be supported on the second support hole; and
   joining the first coupling block and the second coupling block,
   wherein the forming the first barrel accommodating hole and the first support hole is conducted in a state in which the first insulating member and the first base member are combined, and wherein the forming the second barrel accommodating hole and the second support hole is conducted in a state in which the second insulating member and the second base member are combined.

2. The method of claim 1, wherein the forming of the first coupling block includes:
arranging a first adhesive sheet between the first base member and the first insulating member; and
heating and pressing the first adhesive sheet, and
the forming of the second coupling block includes:
arranging a second adhesive sheet between the second base member and the second insulating member; and
heating and pressing the second adhesive sheet.

3. The method of claim 2, wherein the first adhesive sheet and the second adhesive sheet include a curable adhesive.

4. The method of claim 1, wherein the first base member and the second base member have different thicknesses.

5. The method of claim 1, wherein the forming of the first coupling block includes:
forming a first depressed portion on one surface of the first base member;
filling the first depressed portion with a resin;
covering the first depressed portion filled with the resin with a first cover;
curing the resin; and
separating the first cover.

6. The method of claim 1, wherein the forming of the second coupling block includes:
forming a second depressed portion on one surface of the second base member;
filling the second depressed portion with a resin;
covering the second depressed portion filled with the resin with a second cover;
curing the resin; and
separating the second cover.

7. The method of claim 1, wherein the forming of the first coupling block and the second coupling block includes insert-injecting the first insulating member and the second insulating member into the first and second base members, respectively.

8. The method of claim 1, wherein the first base member and the second base member each include a first coupling groove and a second coupling groove on surfaces on which the first insulating member and the second insulating member are formed.

9. The method of claim 8, wherein cross-sectional areas of the first coupling groove and the second coupling groove are widened toward a bottom.

10. The method of claim 8, wherein the first coupling groove and the second coupling groove are formed in an area in which the first barrel accommodating hole and the second barrel accommodating hole are not formed.

11. The method of claim 8, wherein the first coupling groove and the second coupling groove surround the first barrel accommodating hole and the second barrel accommodating hole.

12. The method of claim 8, wherein the first base member and the second base member each include a first coupling hole and a second coupling hole penetrating in a thickness direction.

13. The method of claim 12, wherein the first coupling hole and the second coupling hole are formed in an area in which the first barrel accommodating hole and the second barrel accommodating hole are not formed.

14. The method of claim 1, further comprising:
interposing a gap plate between the first coupling block and the second coupling block.

15. A method of fabricating a test socket that supports a probe stretchable in a longitudinal direction, the method comprising:
forming a first barrel accommodating hole for accommodating a part of the probe in a first base member made of a conductive material, and forming a first coupling block by joining the first base member and a first insulating member made of an insulating material;
forming a second barrel accommodating hole for accommodating the rest of the probe in a second base member made of the conductive material, and forming a second coupling block by joining the second base member and a second insulating member made of the insulating material;
forming a first support hole for supporting one end portion of the probe in the first insulating member through the first barrel accommodating hole;
forming a second support hole for supporting the other end portion of the probe in the second insulating member through the second barrel accommodating hole;
inserting one end of the probe into the first barrel accommodating hole to be supported on the first support hole, and inserting the other end of the probe into the second barrel accommodating hole to be supported on the second support hole; and
joining the first coupling block and the second coupling block,
wherein the forming the first barrel accommodating hole and the first support hole is conducted in a state in which the first insulating member and the first base member are combined, and
wherein the forming the second barrel accommodating hole and the second support hole is conducted in a state in which the second insulating member and the second base member are combined.

* * * * *